(12) United States Patent
Gambino et al.

(10) Patent No.: US 9,852,944 B2
(45) Date of Patent: Dec. 26, 2017

(54) BACKSIDE CONTACT TO A FINAL SUBSTRATE

(71) Applicant: INTERNATIONAL BUSINESS MACHINES CORPORATION, Armonk, NY (US)

(72) Inventors: Jeffrey P. Gambino, Portland, OR (US); Mark D. Jaffe, Shelburne, VT (US); Steven M. Shank, Jericho, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/274,406

(22) Filed: Sep. 23, 2016

(65) Prior Publication Data

US 2017/0011962 A1    Jan. 12, 2017

Related U.S. Application Data

(62) Division of application No. 14/744,681, filed on Jun. 19, 2015, now Pat. No. 9,514,987.

(51) Int. Cl.
*H01L 21/30* (2006.01)
*H01L 21/768* (2006.01)
(Continued)

(52) U.S. Cl.
CPC .... *H01L 21/76895* (2013.01); *H01L 21/6835* (2013.01); *H01L 21/743* (2013.01);
(Continued)

(58) Field of Classification Search
CPC .......... H01L 21/76895; H01L 21/6835; H01L 23/4825; H01L 23/4827
See application file for complete search history.

(56) References Cited

U.S. PATENT DOCUMENTS 5,071,792 A    12/1991  VanVonno et al.
5,569,621 A    10/1996  Yallup et al.
(Continued)

OTHER PUBLICATIONS

Kuehne et al., "SOI MOSFET with Buried Body Strap by Wafer Bonding," IEEE Transactions on Electron Devices, vol. 45, No, 5, May 1998, pp, 1084-1091.
(Continued)

*Primary Examiner* — Tran Tran
(74) *Attorney, Agent, or Firm* — Sherman IP LLP; Kenneth L. Sherman; Steven Laut

(57) ABSTRACT

Device structures and fabrication methods for a backside contact to a final substrate. An electrically-conducting connection is formed that extends through a device layer of a silicon-on-insulator substrate and partially through a buried insulator layer of the silicon-on-insulator substrate. After the electrically-conducting connection is formed, a handle wafer of the silicon-on-insulator substrate is removed. After the handle wafer is removed, the buried insulator layer is partially removed to expose the electrically-conducting connection. After the buried insulator layer is partially removed, a final substrate is coupled to the buried insulator layer such that the electrically-conducting connection is coupled with the final substrate.

15 Claims, 8 Drawing Sheets

(51) Int. Cl.
    H01L 23/482    (2006.01)
    H01L 21/762    (2006.01)
    H01L 23/532    (2006.01)
    H01L 27/12     (2006.01)
    H01L 29/06     (2006.01)
    H01L 29/10     (2006.01)
    H01L 21/683    (2006.01)
    H01L 21/74     (2006.01)

(52) U.S. Cl.
    CPC .. *H01L 21/76251* (2013.01); *H01L 21/76898* (2013.01); *H01L 23/4825* (2013.01); *H01L 23/4827* (2013.01); *H01L 23/53271* (2013.01); *H01L 27/1203* (2013.01); *H01L 29/0649* (2013.01); *H01L 29/1087* (2013.01); *H01L 2221/6834* (2013.01); *H01L 2221/68327* (2013.01); *H01L 2221/68368* (2013.01)

(56) References Cited

U.S. PATENT DOCUMENTS

| | | | |
|---|---|---|---|
| 6,215,155 | B1 | 4/2001 | Wollesen |
| 6,437,405 | B2 | 8/2002 | Kim |
| 6,759,282 | B2 | 7/2004 | Campbell et al. |
| 8,021,943 | B2 | 9/2011 | Botula et al. |
| 8,198,734 | B2 | 6/2012 | Anderson et al. |
| 2011/0260248 | A1* | 10/2011 | Smeys ............ H01L 21/76898 257/347 |
| 2012/0104497 | A1 | 5/2012 | Denison et al. |
| 2013/0181322 | A1 | 7/2013 | Hurwitz et al. |
| 2016/0172314 | A1 | 6/2016 | Cheng et al. |

OTHER PUBLICATIONS

Anonymous, "Method and Structure for Forming Integrated Circuit with Controlled-Shape Backside Contact Patterns for 3D Integration" IPCOM000197767D, ip.com, published Jul. 21, 2010, pp. 1-3.

Ali et al, "RF Performance of SOI CMOS Technology on Commercial 200-mm Enhanced Signal Integrity High Resistivity SOI Substrate," IEEE Transactions on Electron Devices, vol. 61, No. 3, Mar. 2014, pp. 722-728.

Lederer et al., "RF Performance of a Commercial SOI Technology Transferred Onto a Passivated HR Silicon Substrate," IEEE Transactions on Electron Devices, vol. 55, No. 7, Jul. 2008, pp. 1664-1671.

List of IBM Patents or Patent Applications Treated as Related Form.

* cited by examiner

BACKSIDE CONTACT TO A FINAL SUBSTRATE

BACKGROUND

Devices fabricated using semiconductor-on-insulator (SOI) technologies may exhibit certain performance improvements in comparison with comparable devices built directly in a bulk silicon substrate. Generally, an SOI wafer includes a thin device layer of semiconductor material, a handle substrate, and a thin buried insulator layer, such as a buried oxide or BOX layer, physically separating and electrically isolating the device layer from the handle substrate. Integrated circuits are fabricated using the semiconductor material of the device layer.

Wafer thinning has been driven by the need to make packages thinner to accommodate stacking and high density packaging of chips. An SOI wafer may be thinned by removing the handle wafer from its construction. Once thinned, the backside surface of the SOI wafer may be subjected to additional operations. To lend mechanical support during thinning and the additional operations performed subsequent to thinning, the frontside surface bearing the integrated circuits may be adhesively bonded to a temporary substrate. After the additional operations are performed, a final substrate may be attached to the backside surface and the temporary substrate may be removed.

Improved device structures and fabrication methods are needed for a backside contact to a final substrate.

SUMMARY

In an embodiment, a method is provided for fabricating a backside contact using a silicon-on-insulator substrate that includes a device layer, a buried insulator layer, and a handle wafer. An electrically-conducting connection is formed that extends through the device layer and partially through the buried insulator layer. After the electrically-conducting connection is formed, the handle wafer is removed. After the handle wafer is removed, the buried insulator layer is partially removed to expose the electrically-conducting connection. After the buried insulator layer is partially removed, a final substrate is coupled to the buried insulator layer such that the electrically-conducting connection contacts the final substrate. The backside contact comprises the electrically-conducting connection.

BRIEF DESCRIPTION OF THE DRAWINGS

The accompanying drawings, which are incorporated in and constitute a part of this specification, illustrate various embodiments and, together with a general description given above and the detailed description of the embodiments given below, serve to explain the embodiments.

DETAILED DESCRIPTION

Figure 1:
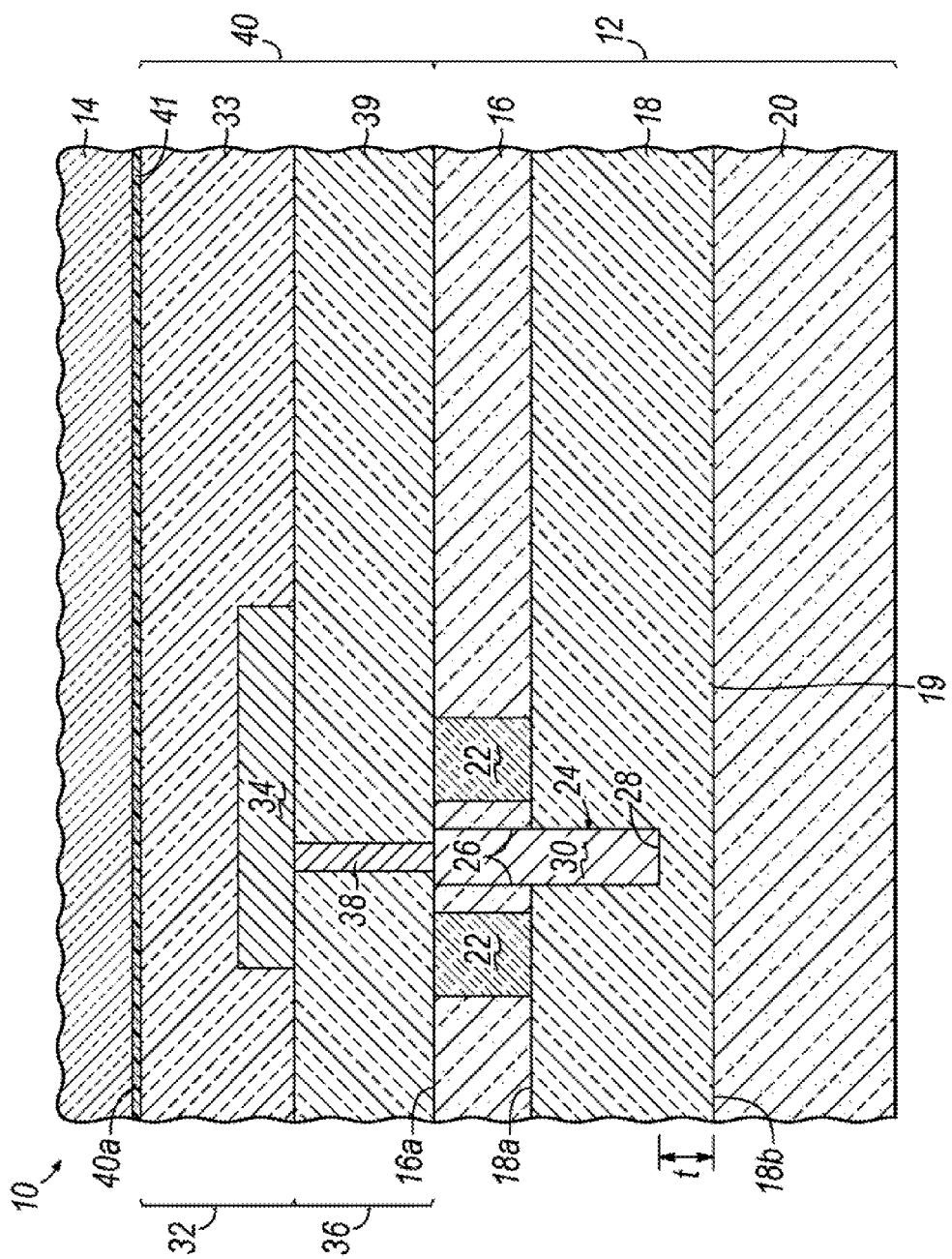
FIGS. 1-3 are cross-sectional views of a portion of a substrate at successive fabrication stages of a processing method for fabricating a device structure in accordance with an embodiment.

With reference to FIG. 1 and in accordance with an embodiment, an assembly 10 includes a semiconductor-on-insulator (SOI) substrate 12 and a temporary substrate 14 that is removably attached to the SOI substrate 12. The SOI substrate 12 may include a device layer 16, a buried insulator layer 18, and a handle wafer 20. The device layer 16 is separated from the handle wafer 20 by the intervening buried insulator layer 18 and is considerably thinner than the handle wafer 20. The device layer 16 is in direct contact with a front surface 18a of the buried insulator layer 18, and the buried insulator layer 18 includes a backside or back surface 18b in direct contact with the handle wafer 20. The buried insulator layer 18 may be comprised of an electrical insulator and, in particular, may be a buried oxide layer comprised of silicon dioxide (e.g., $SiO_2$).

Shallow trench isolation regions 22 may be formed in the device layer 16 of the SOI substrate 12 to define a device region in the device layer 16. The shallow trench isolation regions 22 may be formed by depositing a hardmask, patterning the hardmask and device layer 16 with lithography and etching processes to define trenches, depositing an electrical insulator to fill the trenches, planarizing the electrical insulator relative to the hardmask using a chemical mechanical polishing (CMP) process, and removing the hardmask. In one embodiment, the shallow trench isolation regions 22 may be comprised of silicon dioxide ($SiO_2$) deposited by low-pressure chemical vapor phase deposition (LPCVD), and may penetrate completely through the device layer 16 to the front surface 18a of the buried insulator layer 18.

A trench 24 is formed that extends from a top surface 16a of the device layer 16 through the device layer 16, beyond a front surface 18a of the buried insulator layer 18 forming an interface with the device layer 16, and partially through the buried insulator layer The sidewalls 26 of the trench 24 do not penetrate through the interface 19 between the buried insulator layer 18 and the handle wafer 20. The trench 24 has a bottom surface 28 that is separated from the interface 19 by a partial thickness, t, or portion of the buried insulator layer 18. To form the trench 24, a mask layer may be applied on a top surface 16a of the device layer 16 and patterned with photolithography. Specifically, an opening is defined in the mask layer at the intended location of the trench 24 to be subsequently formed. To that end, the mask layer may comprise a light-sensitive material, such as a photoresist, that is applied by a spin coating process, pre-baked, exposed to light projected through a photomask, baked after exposure, and developed with a chemical developer to define an etch mask. An etching process is used, with the mask layer present on the top surface 16a of the device layer 16, to form the trench 24 at the location of the opening. The etching process may be conducted in a single etching step or multiple etching steps, may rely on one or more etch chemistries, and may be performed under conditions controlled to provide the limited penetration depth into the SOI substrate 10. The mask layer may be removed after the trench 24 is formed by the etching process. If comprised of a photoresist, the mask layer may be removed by ashing or solvent stripping, followed by a conventional cleaning process.

A contact plug 30 is formed in the trench 24 and conforms in geometrical shape to the geometrical shape of the trench 24. In that regard, the sidewalls and bottom surface of the contact plug 30 are respectively coextensive with the sidewalls 26 and bottom surface 28 of the trench 24. The contact plug 30 extends from one end adjacent to the top surface 16a of the device layer 16 through the device layer 16 and partially through the buried insulator layer 18 to an opposite end that is proximate to the interface 19. As a consequence of the limited depth of the trench 24, the contact plug 30 terminates within the buried insulator layer 18.

The contact plug 30 may be comprised of a semiconductor material. In a representative embodiment, the semiconductor material comprising the contact plug 30 may be polysilicon (i.e. polycrystalline silicon) representative that is deposited by chemical vapor deposition (CVD). The polysilicon of the contact plug 30 may contain a dopant (e.g., an n-type dopant from Group V of the Periodic Table (e.g., phosphorus (P), arsenic (As), or antimony (Sb)) or a p-type dopant from Group III of the Periodic Table (e.g., boron)) in a concentration effective to enhance its electrical conductivity and to either impart either n-type or p-type conductivity to the polysilicon.

Front-end-of-line (FEOL) processing is used to fabricate device structures of one or more integrated circuits using the device layer 16 and form a chip. The device structures may be bipolar junction transistors, field effect transistors, and/or coplanar waveguide (CPW) transmission lines, and the integrated circuits on chips formed from the assembly 10 may be configured for end use in high-frequency and high-power applications (e.g., power amplifiers for wireless communications systems and mobile devices) and in high-speed logic circuits.

The integrated circuits may include various functional blocks, such as switches, power amplifiers, power management units, filters, etc.

Middle-of-line (MOL) and back-end-of-line (BEOL) processing follows FEOL processing to form an interconnect structure 40 on the device layer 16 of the SOI substrate 12. The interconnect structure 40 is coupled with the integrated circuits of the chip. Other active and passive circuit elements, such as diodes, resistors, capacitors, varactors, and inductors, may be integrated into the interconnect structure 40 and available for use in the integrated circuit. The interconnect structure 40 may be comprised of a plurality of wiring levels that supply conductive paths for signals, clock, power, etc.

In the representative embodiment, the interconnect structure 40 includes a wiring level 32 with a wire 34 located in a dielectric layer 33 and a wiring level 36 with a conductor-filled via 38 located in a dielectric layer 39. The contact plug 30 is coupled with the wire 34 by the conductor-filled via 38. The wiring levels 32, 36 may be formed by deposition, polishing, lithography, and etching techniques characteristic of a damascene process and/or subtractive patterning. Candidate conductors for the wire 34 and the conductor filling the via 38 are metals such as copper (Cu), aluminum (Al), and tungsten (W). These types of metals may be deposited by chemical vapor deposition or by an electrochemical process like electroplating or electroless plating. The dielectric layers 33, 39 may be comprised of any suitable organic or inorganic dielectric material, such as silicon dioxide, hydrogen-enriched silicon oxycarbide (SiCOH), fluorosilicate glass (FSG), or another type of low-k dielectric material that may be deposited by chemical vapor deposition, such as low-pressure chemical vapor phase deposition or plasma-enhanced chemical vapor deposition (PECVD).

The temporary substrate 14 is removably attached to a top surface 40a of the interconnect structure 40 at the frontside of the SOI substrate 12 while the handle wafer 20 is intact and after the contact plug 30 and the interconnect structure 40 are formed. For example, the temporary substrate 14 may be adhesively bonded by an adhesive layer 41 to the top surface 40a of interconnect structure 40 in order to provide the removability. The temporary substrate 14 is sufficiently thick for mechanical handling when the handle wafer 20 is removed in subsequent fabrication stage to thin the SOI substrate 10 at its backside.

The temporary substrate 14 may be comprised of quartz or a glass, and the adhesive layer 41 may be comprised of a polymer adhesive. The adhesive strength of the adhesive layer 41 may be selected such that the temporary substrate 14 is readily removable from the top surface of the interconnect structure 40 in a subsequent debonding operation.

Figure 2:
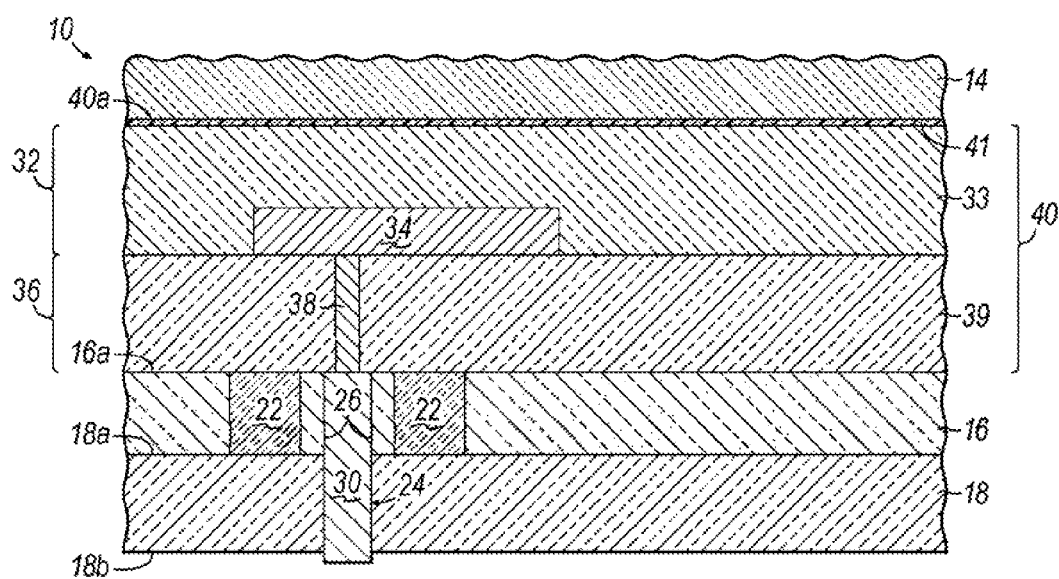

With reference to FIG. 2 in which like reference numerals refer to like features in FIG. 1 and at a subsequent fabrication stage of the processing method, the handle wafer 20 is removed in its entirety by grinding, etching, and/or polishing to expose the back surface 18b of the buried insulator layer 18. The removal of the handle wafer 20 may be performed selective to the removal of the buried insulator layer 18 so that the buried insulator layer 18 remains intact after the handle wafer 20 is removed. As used herein, the term "selective" in reference to a material removal process (e.g., etching) denotes that, with an appropriate etchant choice, the material removal rate for the targeted material is higher than the removal rate for at least another material exposed to the material removal process.

After the handle wafer 20 is removed and with the temporary substrate 14 attached, the buried insulator layer 18 may be partially removed at its back surface 18b selective to the material (e.g., polysilicon) of the contact plug 30 so that the buried insulator layer 18 is thinned before proceeding to the next fabrication stage. The partial removal of the buried insulator layer 18 may be accomplished by polishing and/or etching processes so that the contact plug 30 is revealed at the bottom surface 28 of the trench 24. In other words, the buried insulator layer 18 is thinned at least to reach the bottom surface 28 of the trench 24.

After exposure, the tip of the contact plug 30 may project by a short distance beyond the back surface 18b of the buried insulator layer 18. In an alternative embodiment, the tip of the contact plug 30 may be coplanar with the back surface 18b. If the buried insulator layer 18 is comprised of silicon dioxide and the contact plug 30 is comprised of polysilicon, a hydrofluoric acid based etchant may be used to remove the material of the buried insulator layer 18 selective to (i.e., at a higher etch rate than) the material of the contact plug 30.

Figure 3:
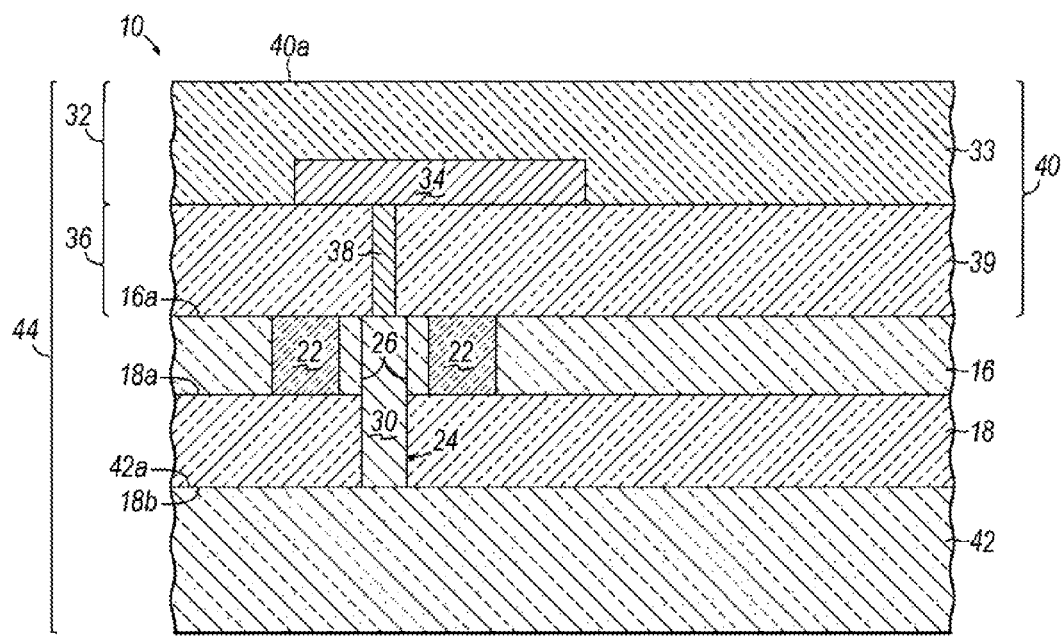

With reference to FIG. 3 in which like reference numerals refer to like features in FIG. 2 and at a subsequent fabrication stage of the processing method, a final substrate 42 is attached to the buried insulator layer 18 to create an intermediate assembly. The temporary substrate 14 is subsequently removed without disturbing the bond between the final substrate 42 and the buried insulator layer 18 to provide a final assembly 44, which includes the device layer 16, the buried insulator layer 18, the interconnect structure 40, and the final substrate 42. In particular, the back surface 18b of the buried insulator layer 18 is placed in contact with a top surface 42a of the final substrate 42, and these surfaces 18b, 42a are subsequently bonded together by, for example, a thermal process (e.g., oxide bonding). In alternative embodiments, additional layers may be disposed between the back surface 18b of the buried insulator layer 18 and the top surface 42a of the final substrate 42. In this intermediate assembly, the device layer 16, the buried insulator layer 18, and the interconnect structure 40 are positioned between the temporary substrate 14 and the final substrate 42.

After attachment to the final substrate 42, the temporary substrate 14 is removed without disturbing the bond between the final substrate 42 and the buried insulator layer 18 to provide a final assembly 44 that includes the device layer 16 and the interconnect structure 40. The temporary substrate 14 functions to facilitate the transfer of the integrated circuits in and on the device layer 16 to the final substrate 42, which carries the device layer 16, the buried insulator layer 18, and the interconnect structure 40. The final substrate 42 in the final assembly 44 replaces the handle wafer 20 of the SOI substrate 10 in the initial assembly 10.

The final substrate 42 may be engineered to reduce harmonics, which may improve linearity in advanced generation switch technology by reducing harmonic distortion (e.g., the linearity observed at the output of coplanar waveguide transmission lines) in comparison with the harmonic distortion that may be expected to be observed with the handle wafer 20 intact and in place at the backside. For example, the second and third harmonics may be improved by more than 20 dB, which may permit devices to meet or surpass inter-modulation distortion switch specifications. In various embodiments, the final substrate 42 may be an engineered high-resistance wafer comprised of high resistance silicon, sapphire, quartz, alumina, etc. The handle wafer 20, which may be an inexpensive substrate (e.g., a common silicon wafer), is present during processing to fabricate the integrated circuits of the chip and is then replaced by the final substrate 42 to provide the final assembly 44 that may be expected to exhibit improved performance metrics.

The contact plug 30 provides an electrical contact (i.e., an ohmic contact) that contributes to an electrically-conducting connection between the device layer 16 and the handle wafer 20, and ultimately between the device layer 16 and the final substrate 42 in the assembly 44 and in the final assembly formed from assembly 44 by removing the temporary substrate 14. The contact plug 30 allows the substrate potential to be controlled by a terminal on the integrated circuit side of the assembly 44 and thereby used to prevent charging events/effects at the times of testing or use that may otherwise arise due to the handle wafer 20 or final substrate 42 floating to a high and unstable potential.

The electrical contact provided by the contact plug 30 is formed and terminated, when formed, within the buried insulator layer 18 of the SOI substrate 12. During the removal of the handle wafer 20, the contact plug 30 is not removed and is protected within the buried insulator layer 18. Subsequent to the removal of the handle wafer 20, the buried insulator layer 18 is thinned to reveal the contact plug 30 so that the final substrate 42 can make electrical contact with the contact plug 30 upon bonding of the final substrate 42 to the buried insulator layer 18.

Figure 4:
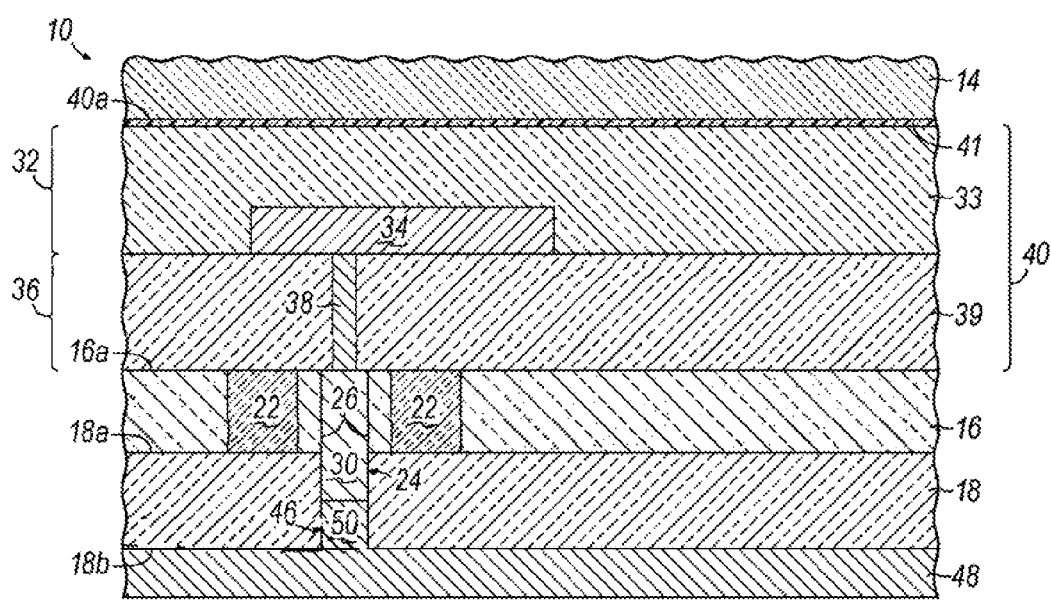
FIGS. 4-5 are cross-sectional views of a portion of a substrate at successive fabrication stages of a processing method for fabricating a device structure in accordance with an alternative embodiment.

With reference to FIG. 4 in which like reference numerals refer to like features in FIG. 2 and at a subsequent fabrication stage of a processing method in accordance with an alternative embodiment, the contact plug 30 may be recessed relative to the back surface 18b of the buried insulator layer 18 to define a cavity or recess 46 at the former location of the removed section of the contact plug 30. The recess 46 extends into the trench 24 in which the residual material of the contact plug 30 resides. In an embodiment, the recess 46 may be formed by etching the contact plug 30 using an etching process that removes the material of the contact plug 30 selective to (i.e., at a higher rate than) the material of the buried insulator layer 18. An exemplary etching process that may be used is a reactive ion etch process using $SF_6$ or $Ar/NF_3$ gas chemistries.

After the contact plug 30 is recessed, a layer 48 may be deposited that coats (i.e., is in direct contact with) the back surface 18b of the buried insulator layer 18. A portion 50 of the material of the layer 48 may fill the recess 46 to reform the contact plug 30. The layer 48 is in contact with the contact plug 30 and buried insulator layer 18, and is eventually in contact with the final substrate 42. The layer 48 may be comprised of a trap-rich material, such as a polycrystalline semiconductor material like polysilicon or another type of engineered low-mobility silicon layer, and may be deposited by chemical vapor deposition with deposition conditions (e.g., temperature and pressure) selected to impart a high density of electrically-active carrier traps. For example, the layer may be deposited with low-temperature chemical vapor deposition. In an embodiment, the carrier traps may impart the layer 48 with a resistivity greater than 1 kΩ-cm. The contact plug 30 may be considered to be a composite structure composed of the residual portion of the original material (e.g., polysilicon) filling the trench 24 and the portion 50 of the trap-rich material contributed by layer 48 filling the recess 46.

In an alternative embodiment, the layer 48 may be deposited in a condition that is not trap-rich and subsequently modified, after deposition, by ion implantation so that the deposited semiconductor material is altered to become enriched with traps. The implanted ions may be generated, for example, from a noble gas (e.g., argon) or from a silicon source gas. The implantation parameters may be selected to provide a projected range and a range straggle confined within the thickness of layer 48, and may also be selected to include multiple energies and ion doses.

In an alternative embodiment, the formation of the recess 46 may be omitted so that the layer 48 only coats the back surface 18b of the buried insulator layer 18 and is electrically connected in the plane of the back surface 18b with the contact plug 30. Accordingly, the contact plug 30 is formed entirely from the initially deposited material. In an alternative embodiment, the contact plug 30 may be completely removed from the trench 24 and a new contact plug may be formed in the trench 24 that is comprised entirely of the material of the layer 48 and that replaces the contact plug 30. The new contact plug may be formed entirely from trap-rich material. In an alternative embodiment, the contact plug 30 may be comprised of a trap-rich material when it is initially deposited in the trench 24. For example, the contact plug 30 may be comprised of polysilicon deposited under conditions to provide a trap-rich material containing a high density of electrically-active carrier traps instead of being deposited under conditions (e.g., at a high substrate temperature) at which the polysilicon is not deposited in a trap-rich state.

Figure 5:
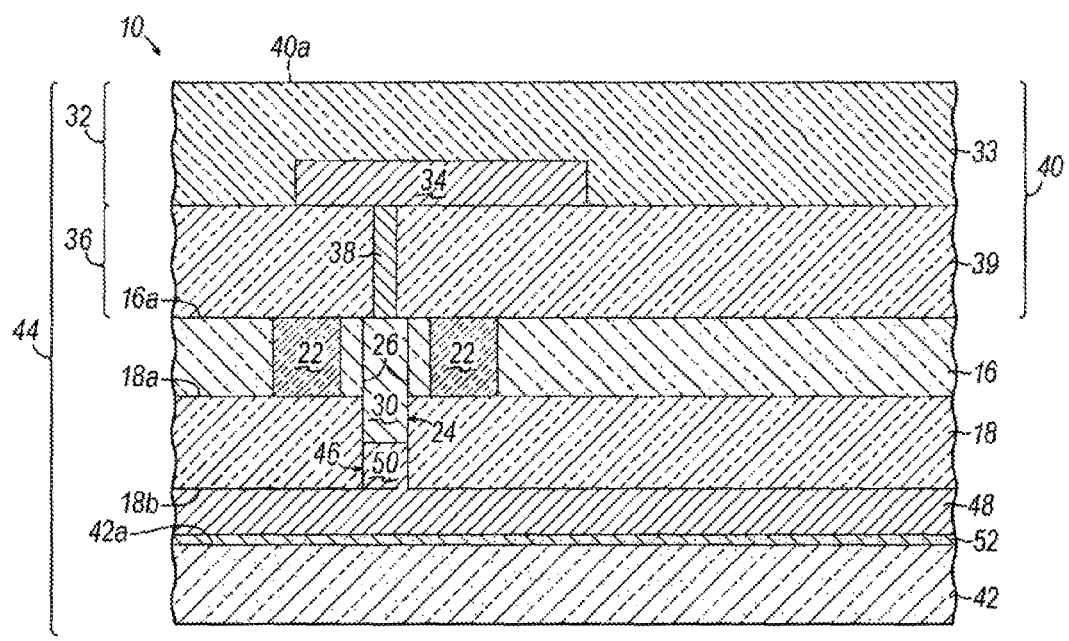

With reference to FIG. 5 in which like reference numerals refer to like features in FIG. 4 and at a subsequent fabrication stage of the processing method, the process flow continues with the attachment of the final substrate 42 to form the assembly 44. The attachment may be provided by an interface layer 52 between confronting surfaces of the final substrate 42 and the layer 48. The interface layer 52 intervenes between the final substrate 42 and the layer 48 so that they are non-contacting and so that the final substrate 42 and the back surface 18b are indirectly attached. In one embodiment, the interface layer 52 may comprise a conductive material, such as an adhesive like a conductive, low-mobility epoxy, that adhesively bonds the final substrate 42 to the layer 48.

In an alternative embodiment, the layer 48 may be omitted and the material of the interface layer 52 may be used to directly attach the top surface 42a of the final substrate 42 to the back surface 18b of the buried insulator layer 18. If a recess 46 is present in the trench 24 when the interface layer 52 is formed, the material of the interface layer 52 may also occupy the space inside of the recess 46 that is not occupied by the contact plug 30.

Figure 6:
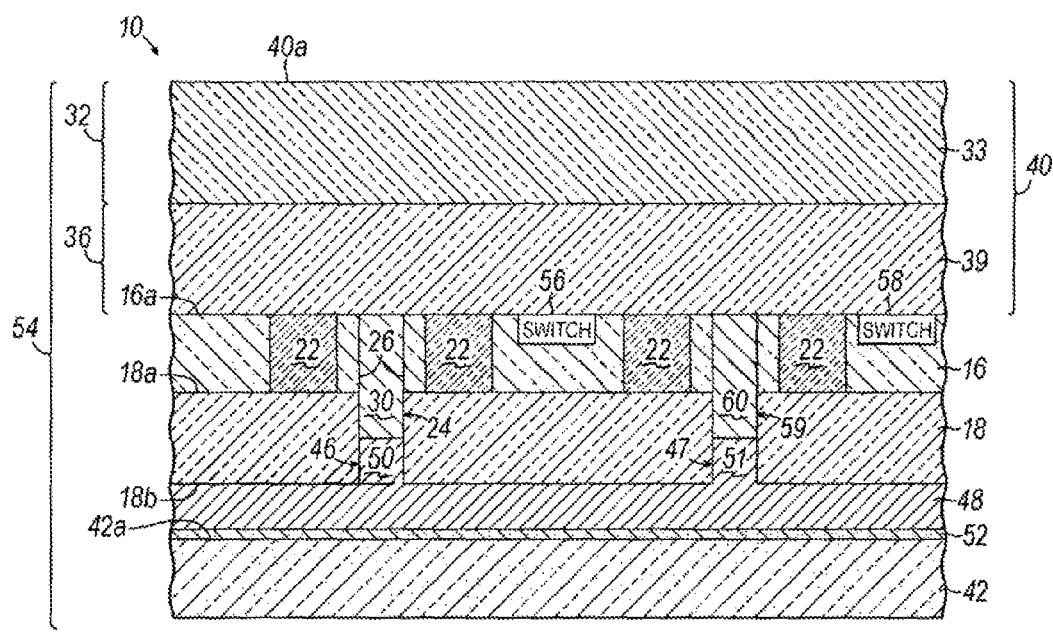
FIG. 6 is a cross-sectional view similar to FIG. 5 of a portion of a substrate in accordance with an alternative embodiment.

With reference to FIG. 6 in which like reference numerals refer to like features in FIG. 5 and in accordance with an alternative embodiment, an assembly 54 includes device structures in the form of switches 56, 58 that may be formed using the device layer 16 by FEOL processing. The switches 56, 58 may be constructed from transistors and, specifically, may comprise NPN or PNP bipolar junction transistors, non-fin-type or planar field effect transistors, or fin-type field effect transistors.

The assembly 54 is otherwise similar in construction to assembly 10. The trench isolation regions 22, along with the buried insulator layer 18, electrically isolate the device region used to form switch 56 from the device region used to form switch 58. Another trench 59 is formed when the trench 24 is formed and another contact plug 60 is formed in the trench 59 when the contact plug 30 is formed in the trench 24. In the representative embodiment, the contact plug 60 is also a composite structure similar to contact plug 30 in that another portion 51 of the layer 48 fills a recess 47 similar to recess 46. In alternative embodiments, the contact plug 60 may be comprised of the semiconductor material initially deposited in the trench 59, or the contact plug 60 may be comprised entirely of the material of the trap-rich layer 48. The contact plugs 30, 60 may have the same construction (e.g., both contact plugs 30, 60 may be composite structures comprised in part of material from the trap-rich layer 48). The contact plugs 30, 60 are arranged in the assembly 54 to surround the switch 56, which effectively isolates the switch 56 from the harmonics generated by switch 58. Collectively, the contact plugs 30, 60 may be considered to provide the electrically-conducting connection.

Figure 7:
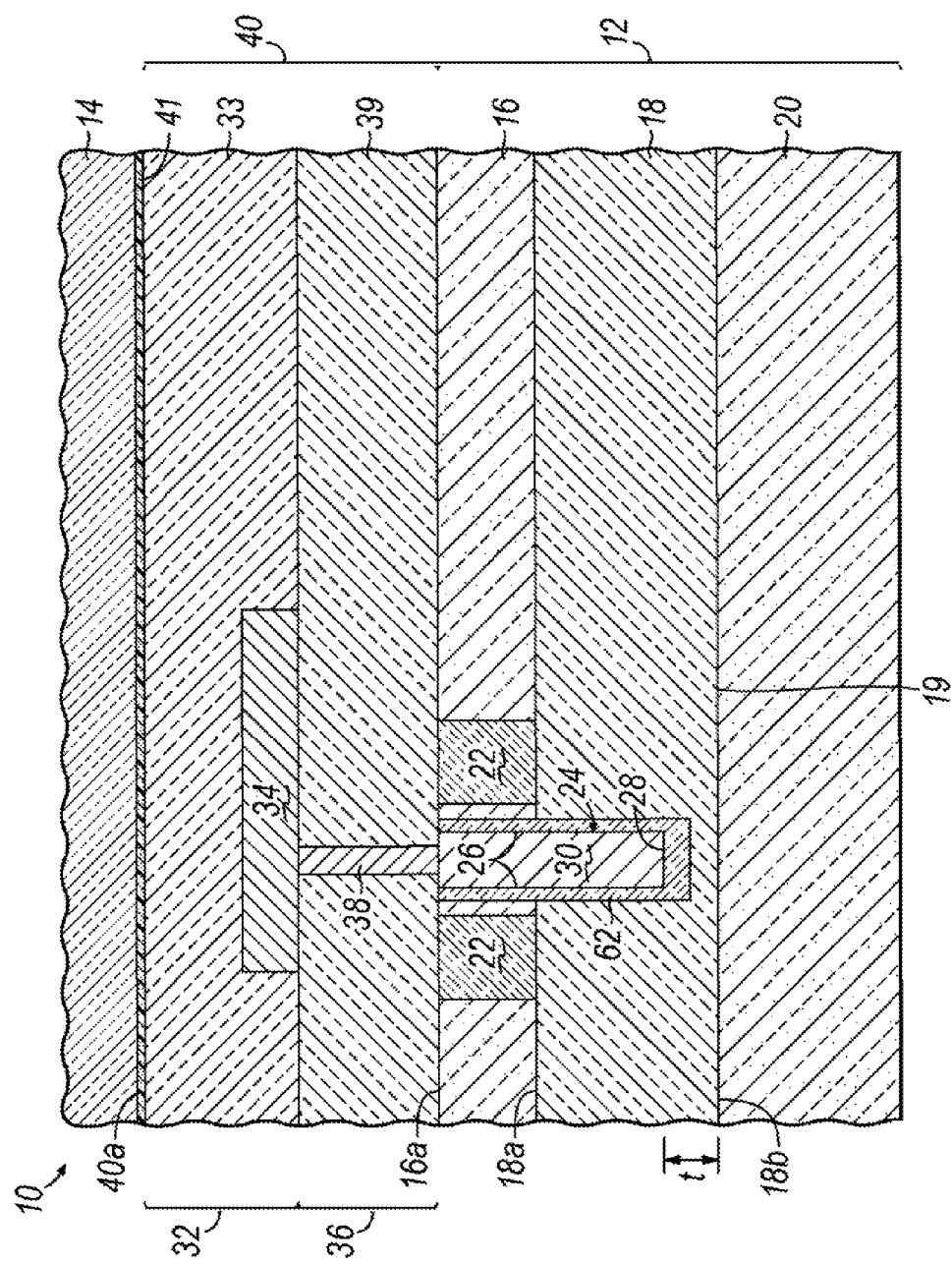
FIGS. 7-8 are cross-sectional views of a portion of a substrate at successive fabrication stages of a processing method for fabricating a device structure in accordance with an alternative embodiment.

With reference to FIG. 7 in which like reference numerals refer to like features in FIG. 1 and in accordance with an alternative embodiment, the trench 24 may be lined with a layer 62 positioned between the contact plug 30 and the device layer 16 and buried insulator layer 18. Specifically, the layer 62 may be formed on the sidewalls 26 and bottom surface 28 of trench 24 before the contact plug 30 is formed. The layer 62 functions as an etch stop when the buried insulator layer 18 is thinned to reveal the contact plug 30 and may be comprised of a dielectric material, such as silicon nitride ($Si_3N_4$) or silicon dioxide formed by a high density plasma process.

Figure 8:
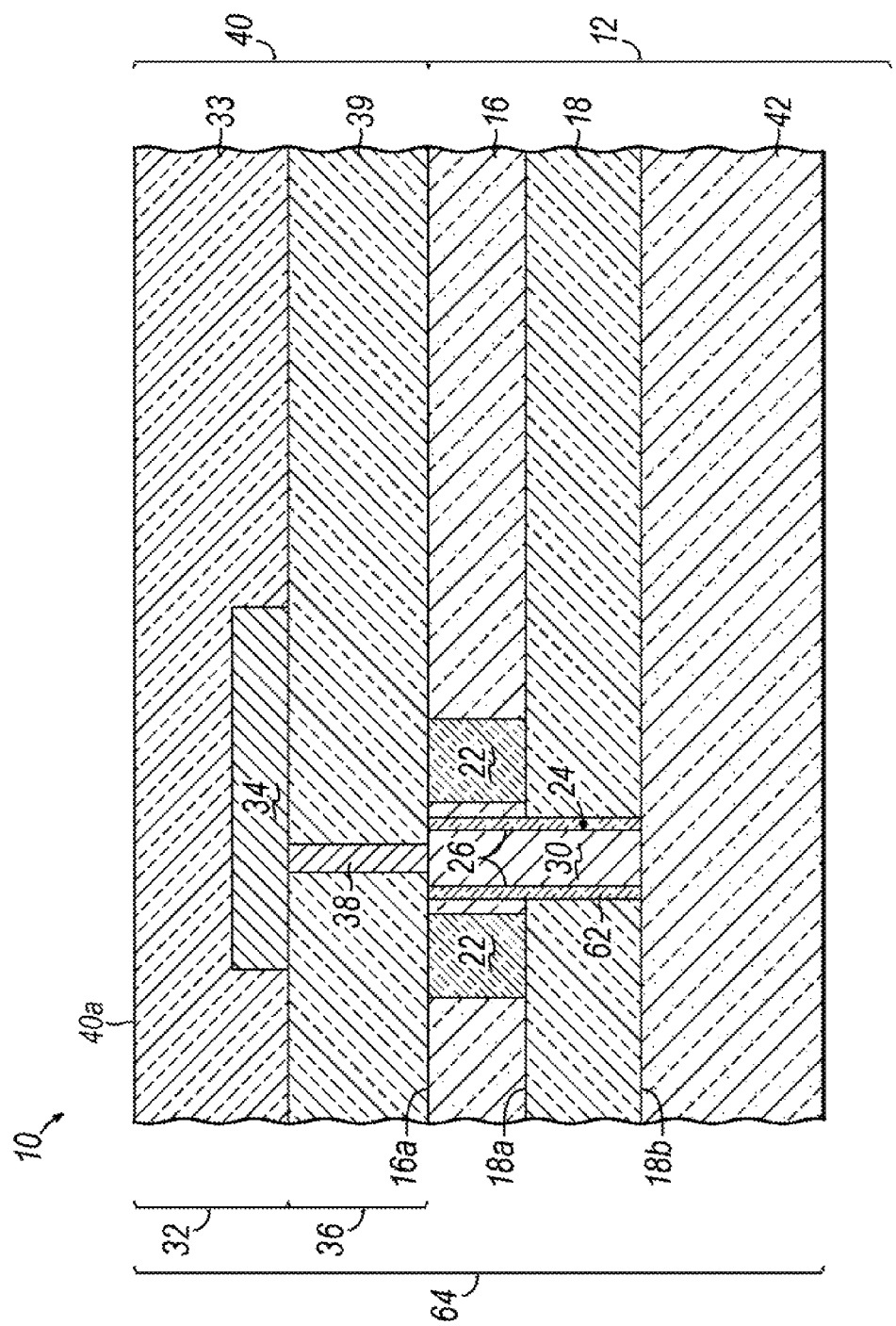

With reference to FIG. 8 in which like reference numerals refer to like features in FIG. 7 and at a subsequent fabrication stage of the processing method, the process flow continues with the thinning of the buried insulator layer to reveal the contact plug 30 and the attachment of the final substrate 42 to form an assembly 64 in which the contact plug 30 provides the electrically-conducting connection.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a backside contact using a silicon-on-insulator substrate that includes a device layer, a buried insulator layer, and a handle wafer, the method comprising:

forming an electrically-conducting connection in a trench that extends through the device layer and partially through the buried insulator layer;

after the electrically-conducting connection is formed, removing the handle wafer;
after the handle wafer is removed, partially removing the buried insulator layer to expose the electrically-conducting connection; and
after the buried insulator layer is partially removed, coupling a final substrate to the buried insulator layer such that the electrically-conducting connection contacts the final substrate,
wherein the backside contact comprises the electrically-conducting connection.

2. The method of claim 1 wherein the buried insulator layer includes a first surface in direct contact with the device layer and a second surface in direct contact with the handle wafer, and the trench has a bottom surface that terminates within the buried insulator layer between the first surface and the second surface when the electrically-conducting connection is formed.

3. The method of claim 2 wherein forming the electrically-conducting connection further comprises:
filling the trench with a semiconductor material.

4. The method of claim 3 wherein forming the electrically-conducting connection further comprises:
before the trench is filled with a semiconductor material, lining the trench with an etch stop layer comprised of a material that etches selective to the semiconductor material.

5. The method of claim 3 wherein the semiconductor material is comprised of polycrystalline silicon, the handle wafer is comprised of silicon, and the final substrate is comprised of quartz, sapphire, or alumina.

6. The method of claim 2 wherein partially removing the buried insulator layer to expose the electrically-conducting connection comprises:
removing a portion of the buried insulator layer to expose the bottom surface of the trench at the second surface of the buried insulator layer.

7. The method of claim 6 wherein coupling the final substrate to the buried insulator layer comprises:
after the bottom surface of the trench is exposed at the second surface of the buried insulator layer, attaching a surface of the final substrate to the second surface of the buried insulator layer to place the electrically-conducting connection in contact with the final substrate.

8. The method of claim 7 wherein the electrically-conducting connection is a contact plug positioned in the trench, and further comprising:
before the surface of the final substrate is attached to the second surface of the buried insulator layer, recessing the contact plug relative to the bottom surface of the trench to define a cavity.

9. The method of claim 8 further comprising:
before the surface of the final substrate is attached to the second surface of the buried insulator layer, depositing a trap-rich layer on the second surface of the buried insulator layer,
wherein a portion of the trap-rich layer fills the cavity.

10. The method of claim 8 wherein coupling the final substrate to the buried insulator layer comprises:
attaching the surface of the final substrate to the second surface of the buried insulator layer with an adhesive layer,
wherein a portion of the adhesive layer fills the cavity.

11. The method of claim 1 wherein the buried insulator layer includes a first surface in direct contact with the device layer and a second surface exposed after the handle wafer is removed, and further comprising:
before the final substrate is coupled to the second surface of the buried insulator layer, depositing a trap-rich layer on the second surface of the buried insulator layer.

12. The method of claim 11 wherein the electrically-conducting connection is a contact plug positioned in the trench, and further comprising:
before the trap-rich layer is deposited, recessing the contact plug relative to the bottom surface of the trench to define a cavity,
wherein a portion of the trap-rich layer fills the cavity.

13. The method of claim 11 wherein the trap-rich layer is comprised of polysilicon deposited under conditions to impart a high density of electrically-active carrier traps.

14. The method of claim 4, wherein the etch stop comprises a dielectric material that etches selective to the semiconductor material of a contact plug.

15. The method of claim 14, wherein the dielectric material is comprised of silicon nitride or silicon dioxide.

* * * * *